(12) United States Patent
Logue et al.

(10) Patent No.: US 7,142,823 B1
(45) Date of Patent: Nov. 28, 2006

(54) LOW JITTER DIGITAL FREQUENCY SYNTHESIZER AND CONTROL THEREOF

(75) Inventors: John D. Logue, Placerville, CA (US); Austin H. Lesea, Los Gatos, CA (US); Wei Lu, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 519 days.

(21) Appl. No.: 10/769,205

(22) Filed: Jan. 29, 2004

(51) Int. Cl.
*H04B 1/40* (2006.01)

(52) U.S. Cl. .................. 455/76; 455/75; 455/83.1; 455/260; 375/371; 375/374; 375/376

(58) Field of Classification Search ........... 455/75, 455/76, 83.1, 260; 375/376, 374, 371; 331/1, 331/11, 18; 327/156, 158, 159
See application file for complete search history.

(56) References Cited

U.S. PATENT DOCUMENTS 5,799,049 A * 8/1998 McFarland et al. ......... 375/362
6,166,606 A * 12/2000 Tsyrganovich ............... 331/25
6,542,040 B1 * 4/2003 Lesea ............................ 331/11
6,995,621 B1 * 2/2006 Culler ........................... 331/57
7,002,415 B1 * 2/2006 Tsyrganovich ............ 331/1 R

* cited by examiner

*Primary Examiner*—Matthew D. Anderson
*Assistant Examiner*—Sanh Phu
(74) *Attorney, Agent, or Firm*—Timothy Markison

(57) ABSTRACT

A low jitter digital frequency synthesizer includes a first counter module, a second counter module, a snapshot module, an error value generation module, and a tapped delay line. The first counter module counts intervals of M cycles of an input clock to produce a first count. The second counter module count intervals of D cycles of an output clock to produce a second count, wherein a rate of the output clock corresponds to M/D times a rate of the input clock. The snapshot module periodically takes a snapshot of the first and second counts to produce snapshots. The error value generation module generates an error value based on the snapshots. The tapped delay line module produces the output clock based on the error value.

36 Claims, 12 Drawing Sheets

DCM - low jitter digital frequency synthesizer 30

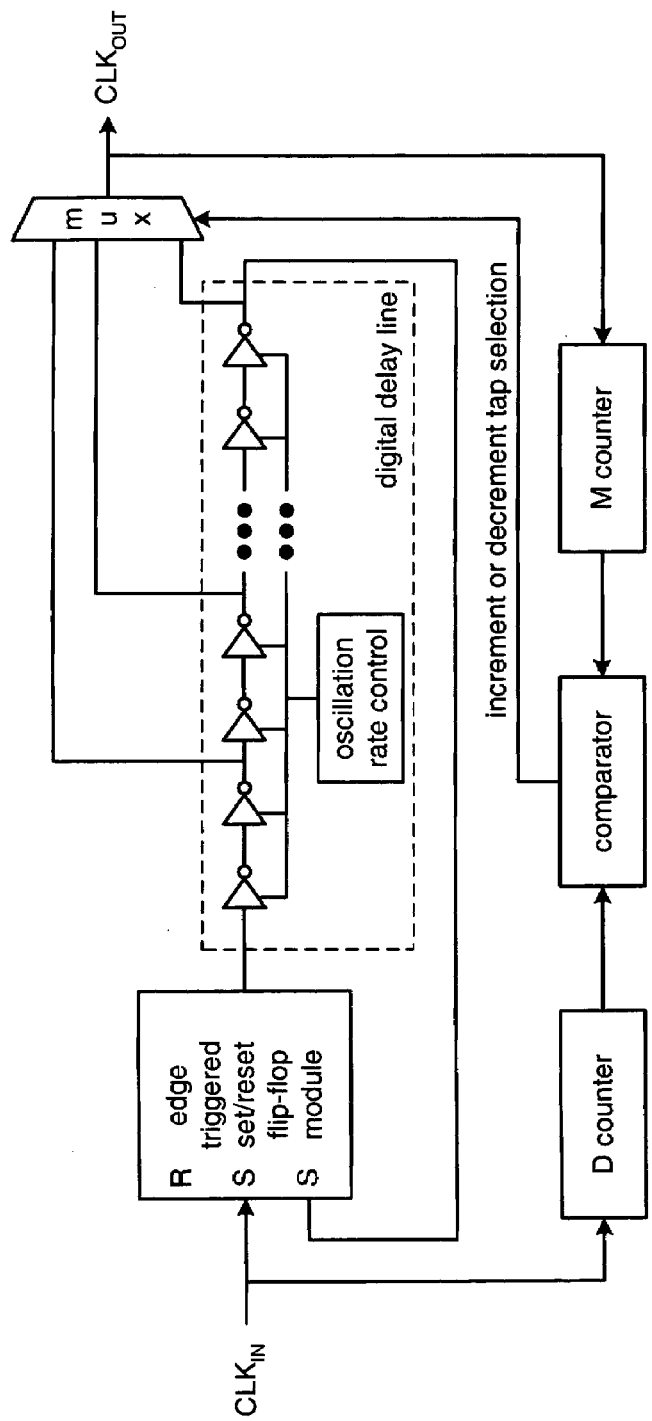
FIG. 1 - Prior Art
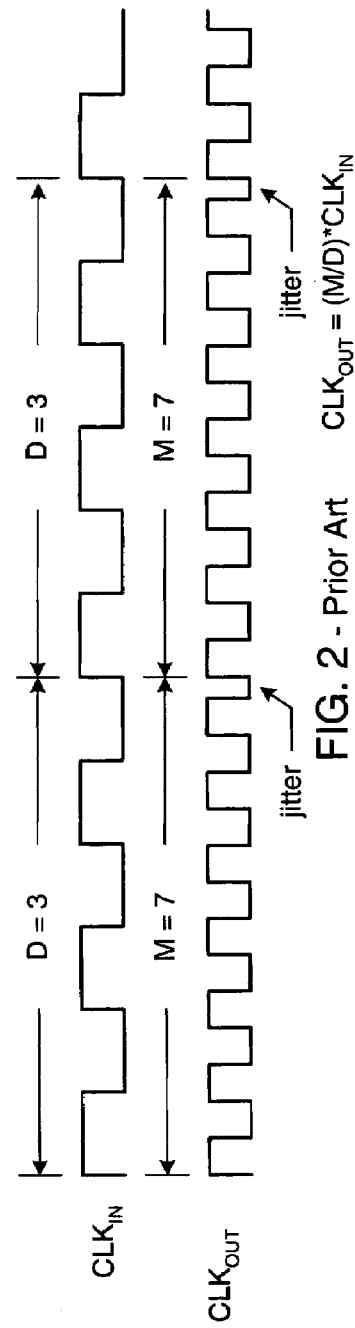
FIG. 2 - Prior Art

DCM - low jitter digital frequency synthesizer 30

DCM - low jitter digital frequency synthesizer 30

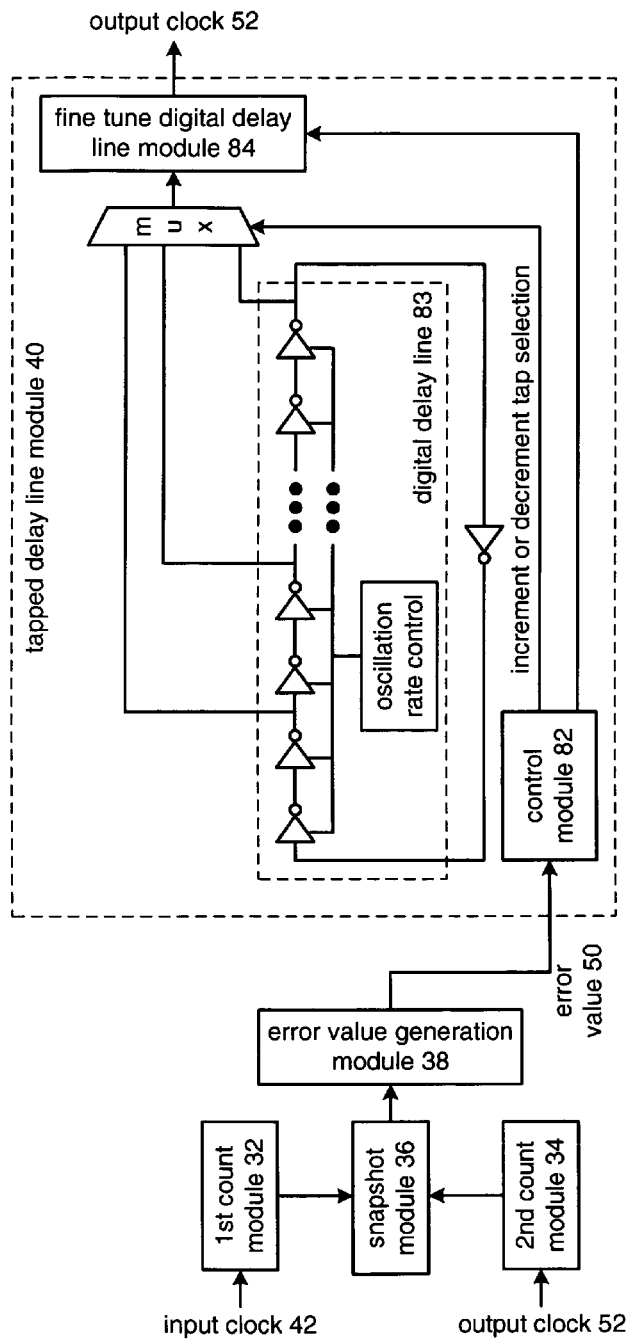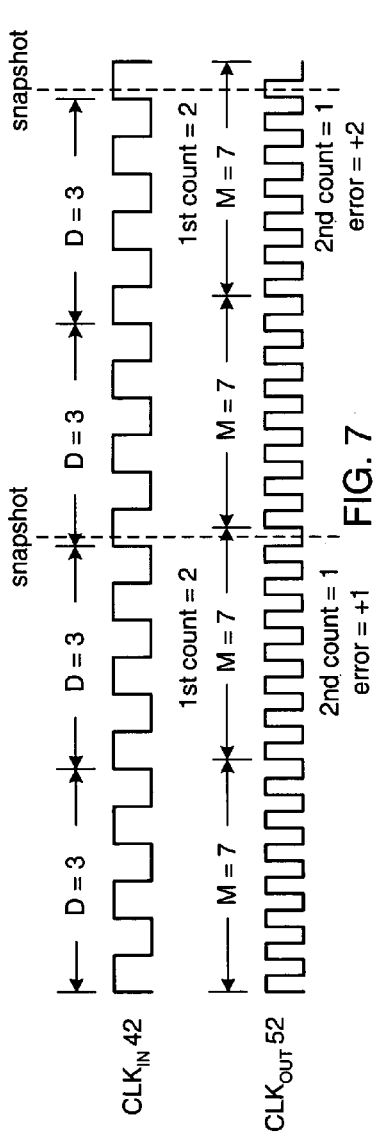
FIG. 6
FIG. 7 error value generation module 38 synchronizer overflow detect tap/trim/tweak adjust for tapped delay line 40 tap/trim/ tweak adjust for tapped delay line 40

LOW JITTER DIGITAL FREQUENCY SYNTHESIZER AND CONTROL THEREOF

BACKGROUND OF THE INVENTION

1. Technical Field of the Invention

This invention relates generally to integrated circuits and more particularly to frequency synthesizers.

2. Description of Related Art

The concept of converting one clock rate to another is well known in the art and is generally referred to as frequency synthesis. One commonly known frequency synthesizer is a phase locked loop (PLL). As is known, a typical implementation of a PLL includes a phase and frequency detector, a charge pump, a loop filter, a voltage controlled oscillator, and a feedback divider. The phase and frequency detector generates an up signal or a down signal based on a phase and/or frequency difference between a reference clock and a feedback clock that is produced by the feedback divider. The phase and frequency detector generates the up signal when the phase and/or frequency of the reference clock leads the phase and/or frequency of the feedback clock, which results when the desired output oscillation is too slow. The phase and frequency detection module generates the down signal when the phase and/or frequency of the reference clock lags the phase and/or frequency of the feedback clock, which results when the desired output oscillation is too fast.

The charge pump converts the up signal and down signal into a current. The loop filter converts the current produced by the charge pump into a control voltage. The voltage controlled oscillator produces the output oscillation (i.e., the desired output clock) based on the control voltage. The feedback divider divides the output oscillation by a divider value to produce the feedback clock. For example, if the reference oscillation is 20 MHz and the desired output oscillation is 110 MHz, the divider value is 5.5.

Such a PLL includes analog circuitry to implement one or more of its components. As is known, analog circuits are susceptible to noise generated by digital circuits. In lower rate applications, i.e., applications that do not push the processing limits of the integrated circuit manufacturing process (e.g., a few hundred MHz for 0.13 micron CMOS technology), the digital noise does not significantly affect the performance of the analog components. However, as the rate of operations increase, the digital noise becomes a more significant issue for the analog components and adversely affects their performance.

Recently, a digital frequency synthesizer has been developed for high rate applications. FIG. 1 illustrates a schematic block diagram of such a digital frequency synthesizer that includes an edge triggered set/reset flip-flop module, a digital delay line, a multiplexer, an M counter, a comparator, and a D counter. In operation, the digital delay line oscillates at a rate of (M/D) times the rate of an input clock (CLK in). For example, if the input clock is 20 MHz, M=7 and D=3, the rate of the output clock (CLK out) is 7/3 times 20 MHz, which equals 46.67 MHz. The rate of the digital delay line can be adjusted via the oscillation rate control module to ensure that the rate is near the desired rate.

To achieve phase and frequency lock between the input clock and the output clock, edge triggered set/reset flip-flop modules sets the input of the delay line at the earlier of D cycles of the input clock or M cycles of the output clock. Further, based on a phase difference between the occurrence of D cycles of the input clock and M cycles of the output clock, the comparator increments or decrements a tap selection of the digital delay line to reduce the phase error between the two clock cycle counts.

While the digital frequency synthesizer of FIG. 1 is a fully digital implementation, thus eliminating the issues with analog frequency synthesizers, a small amount of jitter is produced. FIG. 2 illustrates the generation of such jitter. As shown, for every D cycles of the input clock (e.g., 3), the digital delay line is set causing the output clock to commence in a new cycle in step with a new cycle of the input clock. This forcing of a new cycle, if the output clock is not exactly M/D times the input clock, will cause jitter. In current high rate applications, this small amount of jitter has minimal adverse affects on the operation of the integrated circuit. However, for ultra high rate applications, (e.g., rates approaching the giga Hertz range and above), the small amount of jitter may have some adverse affects on the performance of an integrated circuit.

Therefore, a need exists for a low jitter digital frequency synthesizer and method of controlling such a synthesizer.

BRIEF SUMMARY OF THE INVENTION

The low jitter digital frequency synthesizer and control thereof of the present invention substantially meets these needs and others. In one embodiment, control of a low jitter digital frequency synthesizer begins by counting cycles of an input clock to produce an input clock count and counting cycles of an output clock to produce an output clock count. The processing continues by incrementing a first counter to produce an incremented first count when the input clock count reaches a value of D and by incrementing a second counter to produce an incremented second count when the output clock count reaches a value of M. The processing continues by periodically taking a snapshot of the incremented first count to produce a snapshot first count and periodically taking a snapshot of the incremented second count to produce a snapshot second count. The processing continues by generating an error value based on the snapshot first count and the snapshot second count. The processing continues by adjusting a delay line tap value based on the error value. With such a method and/or apparatus implementing such a method, a free running oscillator is controlled within a digital frequency synthesizer to produce a low jitter output clock signal.

In another embodiment, a low jitter digital frequency synthesizer includes a first counter module, a second counter module, a snapshot module, an error value generation module, and a tapped delay line. The first counter module is operably coupled to count intervals of M cycles of an input clock of the low jitter digital frequency synthesizer to produce a first count. The second counter module is operably coupled to count intervals of D cycles of an output clock of the low jitter digital frequency synthesizer to produce a second count, wherein a rate of the output clock corresponds to M/D times a rate of the input clock. The snapshot module is operably coupled to periodically take a snapshot of the first count to produce a first snapshot and of the second count to produce a second snapshot. The error value generation module is operably coupled to generate an error value based on the first and second snapshots. The tapped delay line module is operably coupled to produce the output clock based on the error value. Such an embodiment provides a low jitter digital frequency synthesizer that utilizes a free running oscillator.

BRIEF DESCRIPTION OF THE SEVERAL VIEWS OF THE DRAWINGS

FIG. 1 is a schematic block diagram of a digital frequency synthesizer in accordance with the prior art;

FIG. 2 is an example timing diagram of the operation of the digital frequency synthesizer of FIG. 1;

FIG. 6 is a schematic block diagram of a low jitter digital frequency synthesizer with the tapped delay line module shown in greater detail in accordance with the present invention;

FIG. 7 is an example timing diagram of the digital frequency synthesizer of FIG. 6;

DETAILED DESCRIPTION OF THE INVENTION

Figure 3:
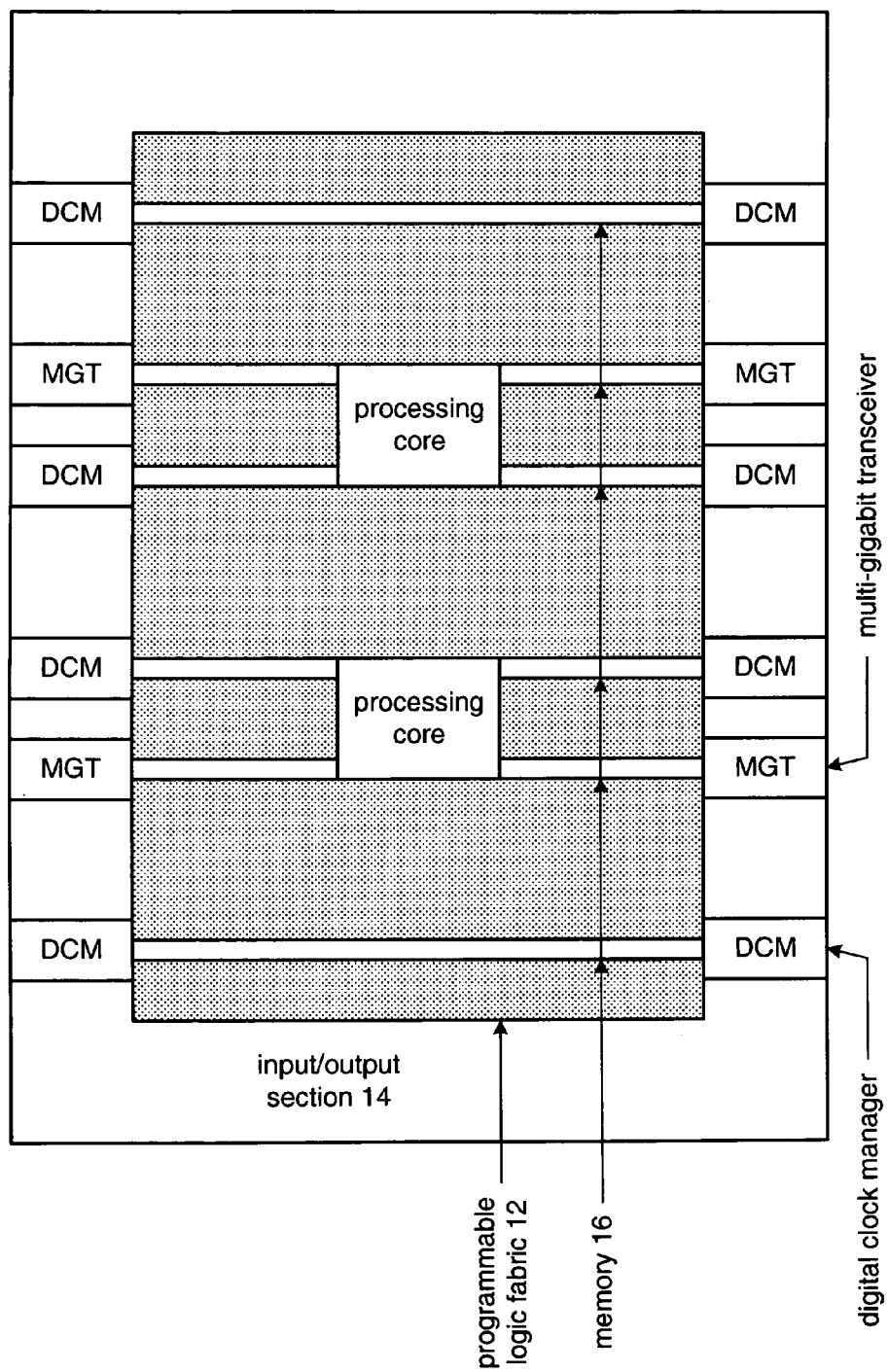
FIG. 3 is a schematic block diagram of a programmable logic device in accordance with the present invention.

FIG. 3 is a schematic block diagram of a programmable logic device 10 that includes programmable logic fabric 12, an input/output section 14, and memory 16. The programmable logic fabric 12 may include one or more processing cores and programmable logic circuitry. Such programmable logic circuitry may include programmable logic arrays (PLA), programmable array logic (PAL) devices, erasable programmable logic devices (EPLD) and/or programmable gate arrays (PGA). The memory 16 may be block random access memory (BRAM). The input/output section 14 may include a plurality of digital clock managers (DCM) and a plurality of multi-gigabit transceivers (MGT).

The digital clock managers (DCM) provide various clock signals to the programmable logic fabric 12 and may further provide clock signals to the multi-gigabit transceivers. The multi-gigabit transceivers provide digital interfaces for the programmable logic fabric 12 to components external to the programmable logic device 10. In general, the multi-gigabit transceivers provide serial to parallel conversion of received serial data and provide parallel to serial conversions for outgoing data.

Figure 4:
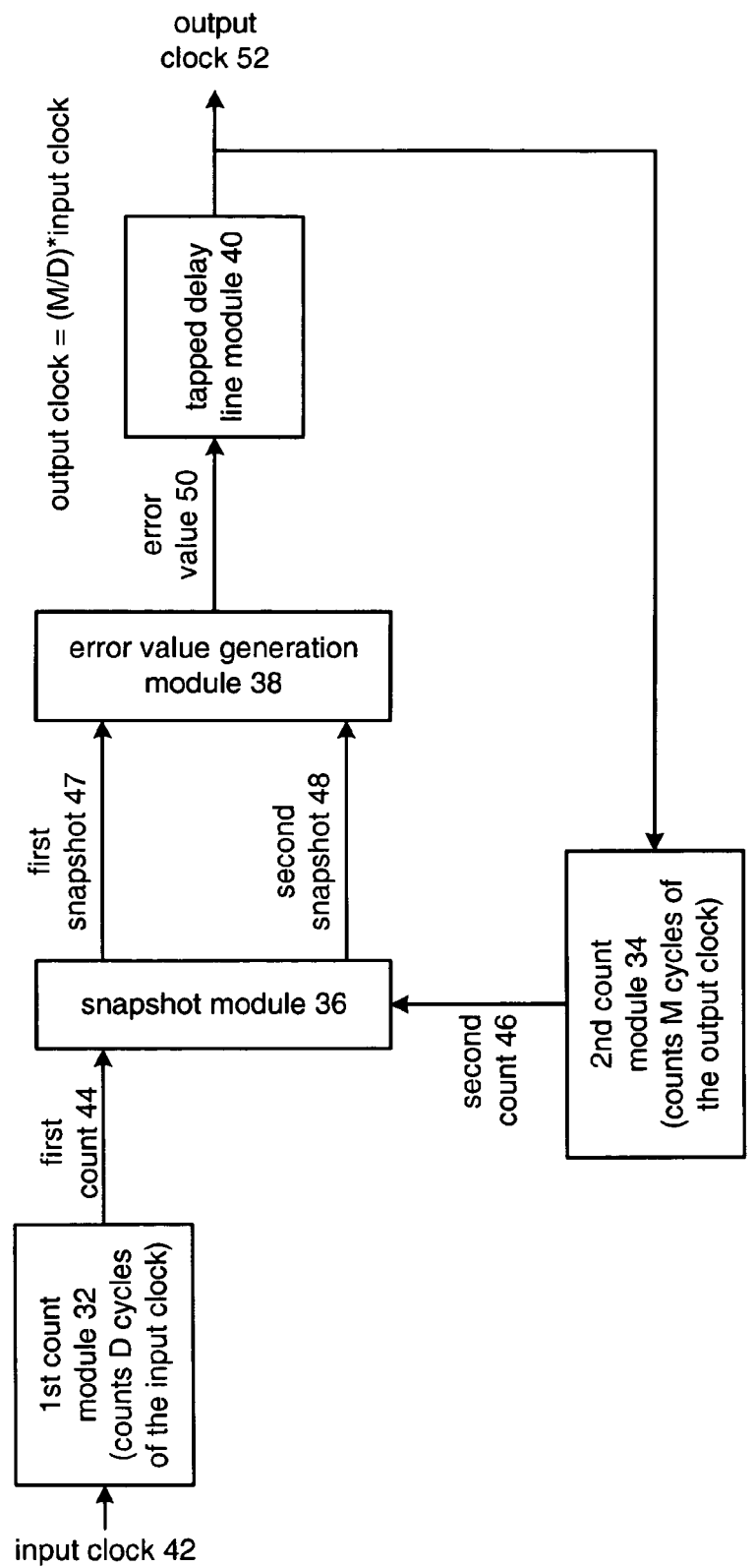
FIG. 4 is a schematic block diagram of a low jitter digital frequency synthesizer in accordance with the present invention.

FIG. 4 is a schematic block diagram of a digital clock manager (DCM) that is implemented as a low jitter digital frequency synthesizer 30. The low jitter digital frequency synthesizer 30 includes a $1^{st}$ count module 32, a $2^{nd}$ count module 34, a snapshot module 36, an error value generation module 38, and a tapped delay line module 40. As configured, the low jitter digital frequency synthesizer 30 is implemented as a free-running oscillator. In particular, the input clock 42 does not control the timing of the tapped delay line module 40 directly. As such, the tapped delay line module 40 does not incur a forced cycle adjustment per the input clock signal and thus avoids the jitter associated with the forced cycle adjustment producing a low jitter output clock 52.

In operation, the low jitter frequency synthesizer 30 produces an output clock 52 based on the input clock 42 and two values (M and D). As shown, the rate of the output clock 52 equals (M/D)* rate of the input clock. The values for M and D may be changed to accommodate different required clock signals for the programmable logic device or for other devices that may incorporate the low jitter digital frequency synthesizer.

To maintain the relationship between the output clock 52 and the input clock 42 while still maintaining the free-running oscillation of the tapped delay line module 40, the $1^{st}$ count module 32 counts D number of cycles of the input clock to produce a $1^{st}$ count value 44. The $2^{nd}$ count module 34 counts M cycles of the output clock to produce a $2^{nd}$ count 46.

The snapshot module 36 takes a snapshot, at periodic intervals, of the $1^{st}$ count 44 to produce a $1^{st}$ snapshot 47 and of the $2^{nd}$ count 46 to produce a $2^{nd}$ snapshot 48. When the snapshot module 36 takes the snapshots of the $1^{st}$ and $2^{nd}$ count values 44 and 46, it resets the $1^{st}$ and $2^{nd}$ count modules 32 and 34, which will be described in greater detail with reference to FIG. 5.

If the output clock 52 corresponds to M/D times the input clock, the snapshot of the $1^{st}$ and $2^{nd}$ counts 47 and 48 should match. If, however, the output clock 52 does not exactly correspond to M/D times the input clock, over time the accumulation of the snapshots of the $1^{st}$ and $2^{nd}$ counts 46 and 48 will drift and thus not match.

The error value generation module 38, which will be described in greater detail with reference to FIGS. 5, 8 and 11, receives the $1^{st}$ and $2^{nd}$ snapshots 47 and 48 to produce an error value 50. The tapped delay line module 40, which will be described in greater detail with reference to FIGS. 5–7, receives the error value 50 and adjusts the particular tap selection to regulate the output clock 52 such that it maintains the M/D times the input clock relationship. As one of average skill in the art will appreciate, the tapped delay line module 40 is established to have a frequency that approximates the M/D times input clock rate where the error value 50 acts as a tap selection control to maintain the proper phase and frequency relationship between the input clock 42 and output clock 52. As one of average skill in the art will further appreciate, the low jitter digital frequency synthesizer 30 may be implemented using a processing module and memory to implement the modules illustrated in FIG. 4 as well as the modules and processing steps illustrated in FIGS. 5–9. The processing module may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory may be a single memory device or a plurality of memory devices. Such a memory device may be a read-only memory, random access memory, volatile memory, non-volatile memory, static memory, dynamic memory, flash memory, cache memory, and/or any device that stores digital information. Note that when the processing module implements one or more of its functions via a state machine, analog circuitry, digital circuitry, and/or logic circuitry, the memory storing the corresponding operational instructions may be embedded within, or external to, the circuitry comprising the state machine, analog circuitry, digital circuitry, and/or logic circuitry.

Figure 5:
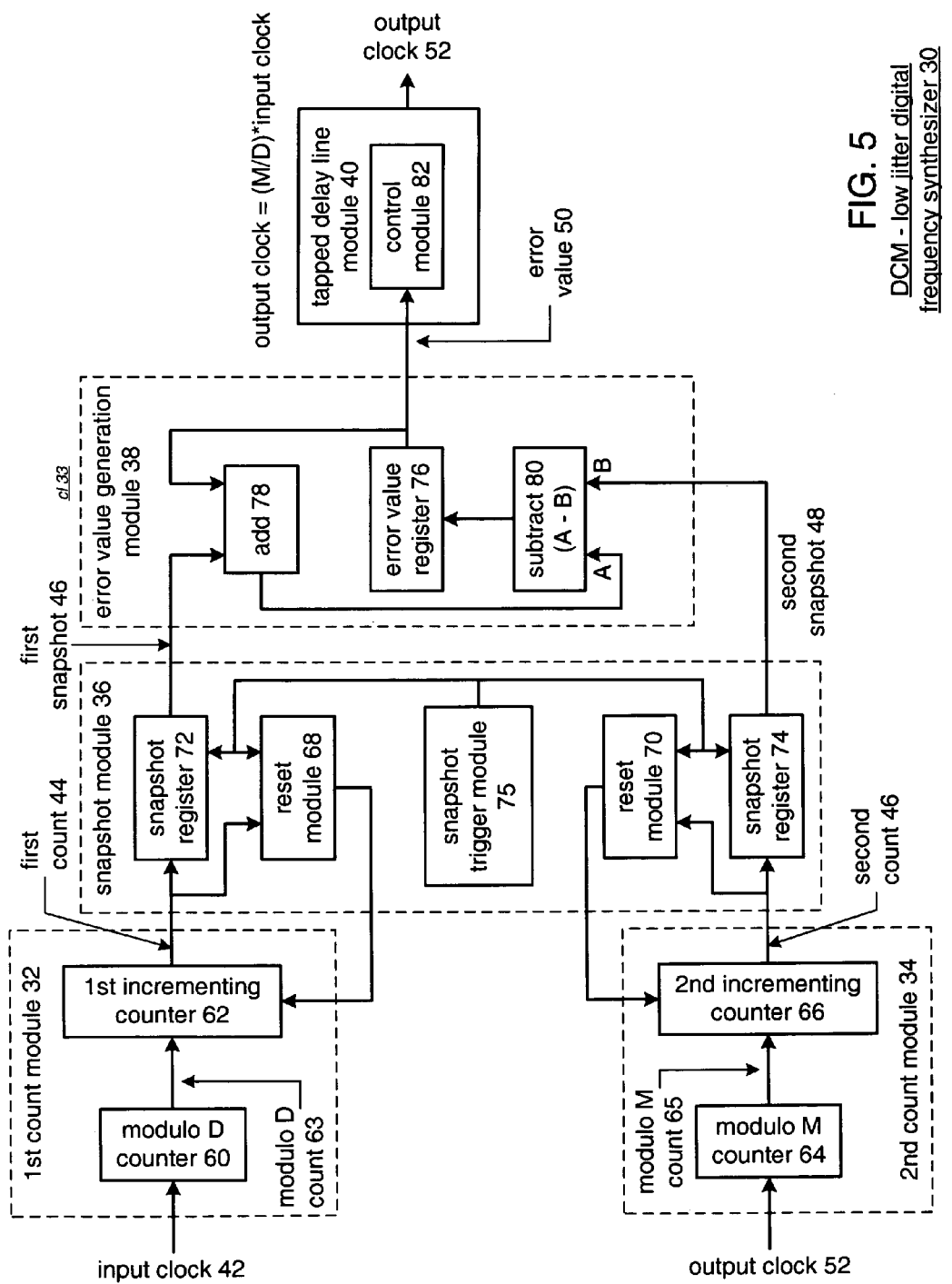
FIG. 5 is a schematic block diagram of another embodiment of a low jitter digital frequency synthesizer in accordance with the present invention.

FIG. 5 is another embodiment of the low jitter digital frequency synthesizer 30 that includes the $1^{st}$ count module 32, the $2^{nd}$ count module 34, the snapshot module 36, the error value generation module 38 and the tapped delay line module 40. The $1^{st}$ count module 32 includes a modulo D counter 60 and a $1^{st}$ incrementing counter 62. The $2^{nd}$ count module 34 includes a modulo M counter 64 and a $2^{nd}$ incrementing counter 66. The snapshot module 36 includes a snapshot register 72, a reset module 68, a snapshot trigger module 75, a reset module 70 and a snapshot register 74. The error value generation module 38 includes an adder 78, an error value register 76 and a subtraction module 80. The tapped delay line module 40 includes a control module 82.

The modulo D counter 60 counts, in a modulo fashion, D cycles of the input clock 42 to produce a modulo D count 63. The incrementing counter 62 counts the wrapping of the modulo D count 63. For instance, if D is 3, every $3^{rd}$ cycle of the input clock 42, the incrementing counter 62 is incremented by 1 to produce the $1^{st}$ count 44. Similarly, the $2^{nd}$ count module 34 utilizes the modulo M counter 64 to count M cycles of the output clock 52 to produce a modulo M count 65. The $2^{nd}$ incrementing counter 66 counts wrapping of the modulo M count 65 to produce the $2^{nd}$ count 46. For example, if M is 7, every $7^{th}$ cycle of the output clock 52, the incrementing counter 66 is incremented by 1.

The snapshot trigger module 75 initiates the taking of the snapshot of the $1^{st}$ count 44 and $2^{nd}$ count 46 by providing an input to the snapshot register 72, snapshot register 74 and reset modules 68 and 70. In general, the sampling interval, or snapshot triggering produced by the snapshot trigger module 75, will occur in sync with the input clock 42 but may range from one modulo count to multiple modulo counts of the input clock signal 42.

Upon receiving the triggering signal, the snapshot register 72 stores the current $1^{st}$ count value 44 that is produced by the $1^{st}$ incrementing counter 62. In addition, the reset module 68 determines whether an increase of the $1^{st}$ count 44 is occurring while the snapshot is being taken. If so, the reset module resets the $1^{st}$ count to a value of 1. If the snapshot does not occur while the increasing of the $1^{st}$ count value is occurring, the reset module 68 resets the $1^{st}$ count to zero.

The snapshot register 74, when triggered via the snapshot triggering module 75, stores the current $2^{nd}$ count value 46. In addition, reset module 70 resets the $2^{nd}$ incrementing counter 66 to either one or zero based on whether the snapshot occurred while the $2^{nd}$ count 46 was being incremented. If the snapshot occurred while the $2^{nd}$ count was being incremented, the $2^{nd}$ incrementing counter 66 is reset to one; otherwise it is reset to zero.

Note that the snapshot module 36 takes the snapshot of the $1^{st}$ count in a $1^{st}$ time domain that corresponds to the input clock. Once a snapshot is taken of the $1^{st}$ count, the snapshot module 36 enables the taking of the snapshot of the $2^{nd}$ count. The snapshot of the $2^{nd}$ count value 46 is done in a $2^{nd}$ time domain that corresponds to the output clock. Once the snapshot of the $2^{nd}$ count value 46 has been taken, the snapshot trigger module 75 is reset such that when the next snapshot period occurs, the snapshot of the $1^{st}$ count value will be taken followed by the taking of the $2^{nd}$ count value.

The error value generation module 38 accumulates differences between the $1^{st}$ snapshot 46 and $2^{nd}$ snapshot 48 to produce the error value 50. If the output clock maintains an exact relationship of M/D times the input clock, the $1^{st}$ and $2^{nd}$ snapshots 46 and 48 will always match and the error value 50 will remain zero or at a constant value. However, due to imperfections in the circuit components, the output clock 52 will not maintain an exact M/D times the input clock 42 relationship. As such, over time, the $1^{st}$ snapshot 46 and $2^{nd}$ snapshot 48 will differ in value. When the difference in value occurs, the error value generation module 38 accumulates the error value 50, which adjusts the tapped delay line module 40.

The error value generation module 38 includes an addition module 78, the error value register 76 and a subtraction module 80. As shown, the addition module 78 adds the current $1^{st}$ snapshot value 46 with a previously stored error value 50. The summed value is provided to subtraction module 80, which subtracts the $2^{nd}$ snapshot value 48 from the output of adder 78. The resultant value is the current error value 50, which is then stored in error value register 76. As such, the new error value corresponds to the previous error value plus the current $1^{st}$ snapshot value 46 minus the current $2^{nd}$ snapshot value 48. If the $1^{st}$ and $2^{nd}$ snapshot values 46 and 48 are equal, the error value remains unchanged. If the $1^{st}$ and $2^{nd}$ snapshot values 46 and 48 are different, the error value will be increased or decreased. As one of average skill in the art will appreciate, the $2^{nd}$ snapshot value 48 may be added to the previous error value via adder 78 and the $1^{st}$ snapshot value 46 may be subtracted via subtraction module 80 to produce the error value 50.

The tapped delay line module 40 includes control module 82, which interprets the error value 50. The control module 82 provides a control signal to a digital delay line, which will be described in greater detail with reference to FIG. 6, to select a corresponding tap and to fine-tune the delay line such that the output clock 52 maintains the desired relationship with the input clock while still allowing the digital delay line to operate as a free-running oscillator. In one embodiment, the control module 82 functions to compare the new error value 50 with a previous error value to determine whether the sign of the error value has changed with respect to the previous error value. If the sign has changed, the control module determines an amount to adjust the tapped delay line based on the current error value and parameters of the digital frequency synthesizer. Such parameters of the digital frequency synthesizer include the granularity of the steps that can be made within the tapped delay line module 40, response times, slew rate, et cetera.

The control module 82 also functions to compare the error value with a previous error value to determine whether the magnitude of the error value has increased with respect to the previous error value. If the magnitude has increased, the control module 82 determines an amount to adjust the tapped delay line based on the increase in magnitude and the parameters of the digital frequency synthesizer. Note that even if the sign changes and/or the magnitude increases, the control module 82 may not immediately adjust the tapped delay line but may wait for further indications that the change is needed.

FIG. 6 is a schematic block diagram of a digital frequency synthesizer that includes the $1^{st}$ count module 32, the $2^{nd}$ count module 34, the snapshot module 36, the error value generation module 38 and the tapped delay line module 40. The tapped delay line module 40 includes a digital delay line 83, the control module 82, a multiplexer (MUX) and a fine-tuned digital delay line module 84. The digital delay line 83 includes a plurality of buffers that produce slight phase shifted representations of the output clock 52. In one embodiment, the digital delay line 83 includes 128 taps. The oscillation rate control module of the digital delay line 83 regulates the rates of the corresponding buffers to adjust the overall oscillation rate of the digital delay line to maintain a rate corresponding to the desired rate of the output clock 52. The digital delay line 83 is a free-running oscillator which is achieved by feeding the output of the last buffer to the input of the $1^{st}$ buffer via an inverter.

The control module 82 receives the error value 50 and produces a signal that either increments, decrements, or maintains the same tap selection, which is provided to the control input of the multiplexer. In addition, the control module 82 generates a control signal to adjust the fine-tuned digital delay line module 84 such that the output clock 52 maintains the desired relationship with the input clock.

FIG. 7 is a timing diagram illustrating an example of the operation of the digital frequency synthesizer of FIG. 6. In this example, D=3 and M=7 such that the rate of the output clock 52 is 7/3rds that of the input clock 42. In this example, the periodic interval for taking snapshots occurs at approximately every two D modulo cycles of the input clock. As shown, for the input clock at the $1^{st}$ snapshot, the $1^{st}$ count equals 2 since the modulo D counter has cycled through two counts of three cycles of the input clock. The output clock 52 is shown to be slightly out of sync with the input clock 42 such that at the $1^{st}$ snapshot the $2^{nd}$ count module 34 has not cycled through two full modulo M cycles of the output clock, which, at the $1^{st}$ snapshot, yields a $2^{nd}$ count of 1. This example assumes that, at the $1^{st}$ snapshot, the error value was zero such that, at the $1^{st}$ snapshot, the error value is calculated to be a positive 1. At the $2^{nd}$ snapshot, the $1^{st}$ count value is again equal to 2 and the $2^{nd}$ count value remains at 1. In this instance, the difference between the $1^{st}$ and $2^{nd}$ counts is added to the previous count to increment the error value to a +2 value. For instance, the new error value equals the previous error value (e.g., +1) plus the $1^{st}$ count (e.g., 2) minus the $2^{nd}$ count (e.g., 1) which, in this example, equals 1+2−1=2.

In this example, at the $2^{nd}$ snapshot value, the control module determines that the error value has increased. At this point, it may adjust the tap selection and/or adjust the fine-tuned digital delay line module 84 to adjust the timing of the output clock 52 to better achieve the desired relationship with the input clock 42.

Figure 8:
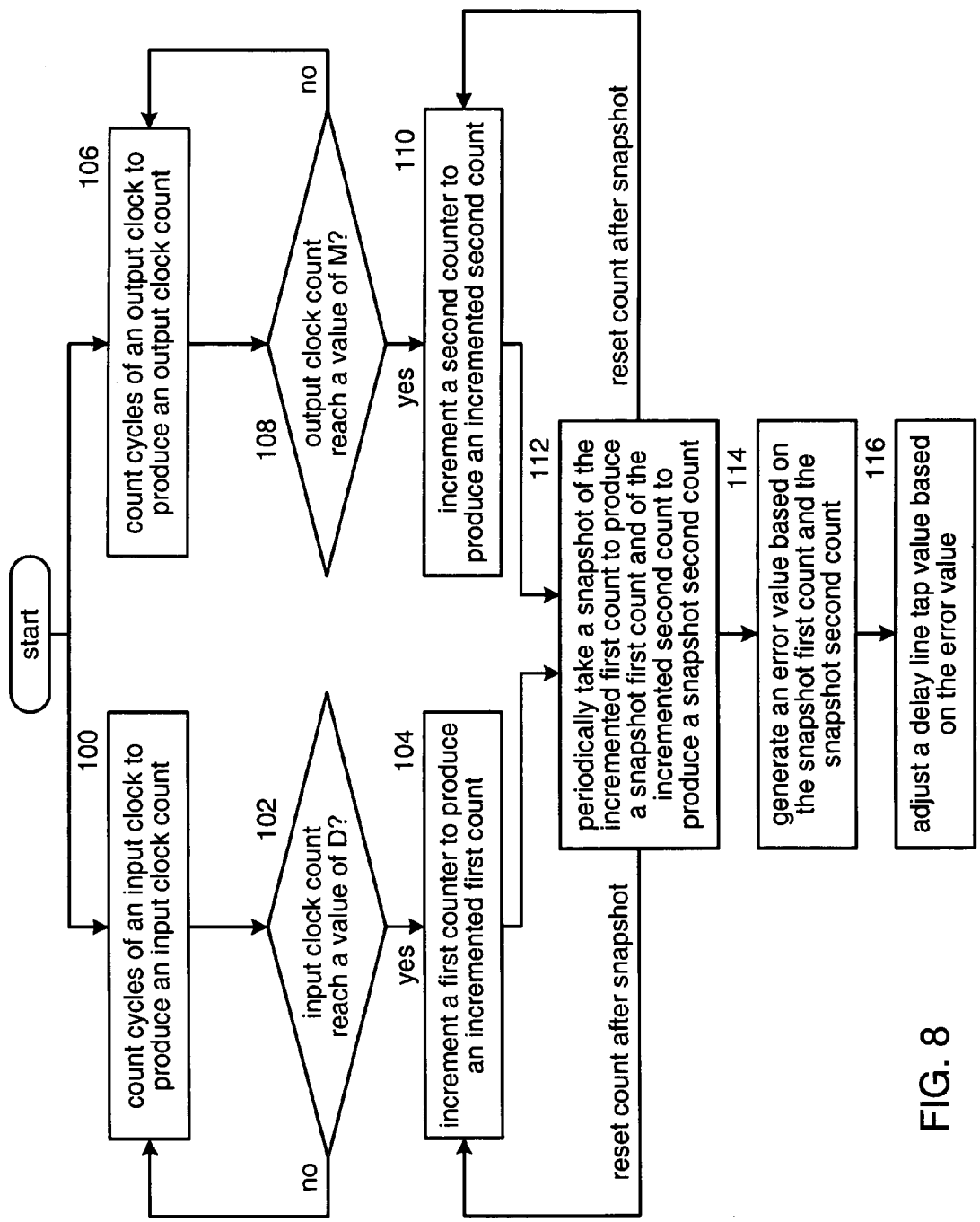
FIG. 8 is a logic diagram of a method for controlling a low jitter digital frequency synthesizer in accordance with the present invention.

FIG. 8 is a logic diagram of a method for controlling a low jitter digital frequency synthesizer. The process begins at Step 100 and 106. At Step 100, cycles of an input clock are counted to produce an input clock count. The process then proceeds to Step 102 where a determination is made as to whether the input clock count reaches a value of D. If not, the process remains in the loop of counting cycles until the input clock count reaches the value of D. When the clock count reaches the value of D, the process proceeds to Step 104 where a $1^{st}$ counter is incremented to produce an incremented $1^{st}$ count.

At Step 106, cycles of an output clock are counted to produce an output clock count. Once the output clock count reaches a value of M the process proceeds to Step 110 where a $2^{nd}$ counter is incremented to produce an incremented $2^{nd}$ count.

The process then proceeds to Step 112 where a snapshot of the incremented $1^{st}$ count is periodically taken to produce a snapshot $1^{st}$ count and a snapshot is periodically taken of the incremented $2^{nd}$ count to produce a snapshot $2^{nd}$ count. In addition, the incrementing of the $1^{st}$ counter and $2^{nd}$ counter are reset once the snapshots are taken. Note that the counting of output cycles at Steps 106 and 108 and the counting of input cycles at Steps 100 and 102 continue as the subsequent processing steps occur.

The process then proceeds to Step 114 where an error value is generated based on the snapshot $1^{st}$ count and the snapshot $2^{nd}$ count. This may be done by adding one of the snapshot $1^{st}$ count or the snapshot $2^{nd}$ count with a previous error value to determine an addition error value. The error value is then determined as the difference between the addition error value and another one of the snapshot $1^{st}$ value and snapshot $2^{nd}$ value. For example, the snapshot $1^{st}$ count may be added to the previous error value to produce the addition error value. The snapshot $2^{nd}$ value may then be subtracted from the addition error value to determine a current error value.

The process then proceeds to Step 116 where a delay line tap value is adjusted based on the error value. This may be done by comparing the error value with a previous error value to determine whether sign of the error value has changed with respect to the previous error value. If the sign has changed, a determination is made as to the amount of the adjusting of the delay line tap as to be made based on the current error value and parameters of the digital frequency synthesizer where such parameters include number of taps within the delay tap line, slew rate of the delay line, et cetera. In addition, the adjusting may be done by comparing the error value with a previous error value to determine whether the magnitude of the error value has increased with respect to the previous error value. If so, a determination is made as to the amount of the adjustment of the delay line tap as to be made based on the current error value and the parameters of the digital frequency synthesizer. As such, the delay line is operating as a free-running oscillator which decouples it from the input clock thereby reducing jitter induced by the input clock to produce a low jitter output clock.

Figure 9:
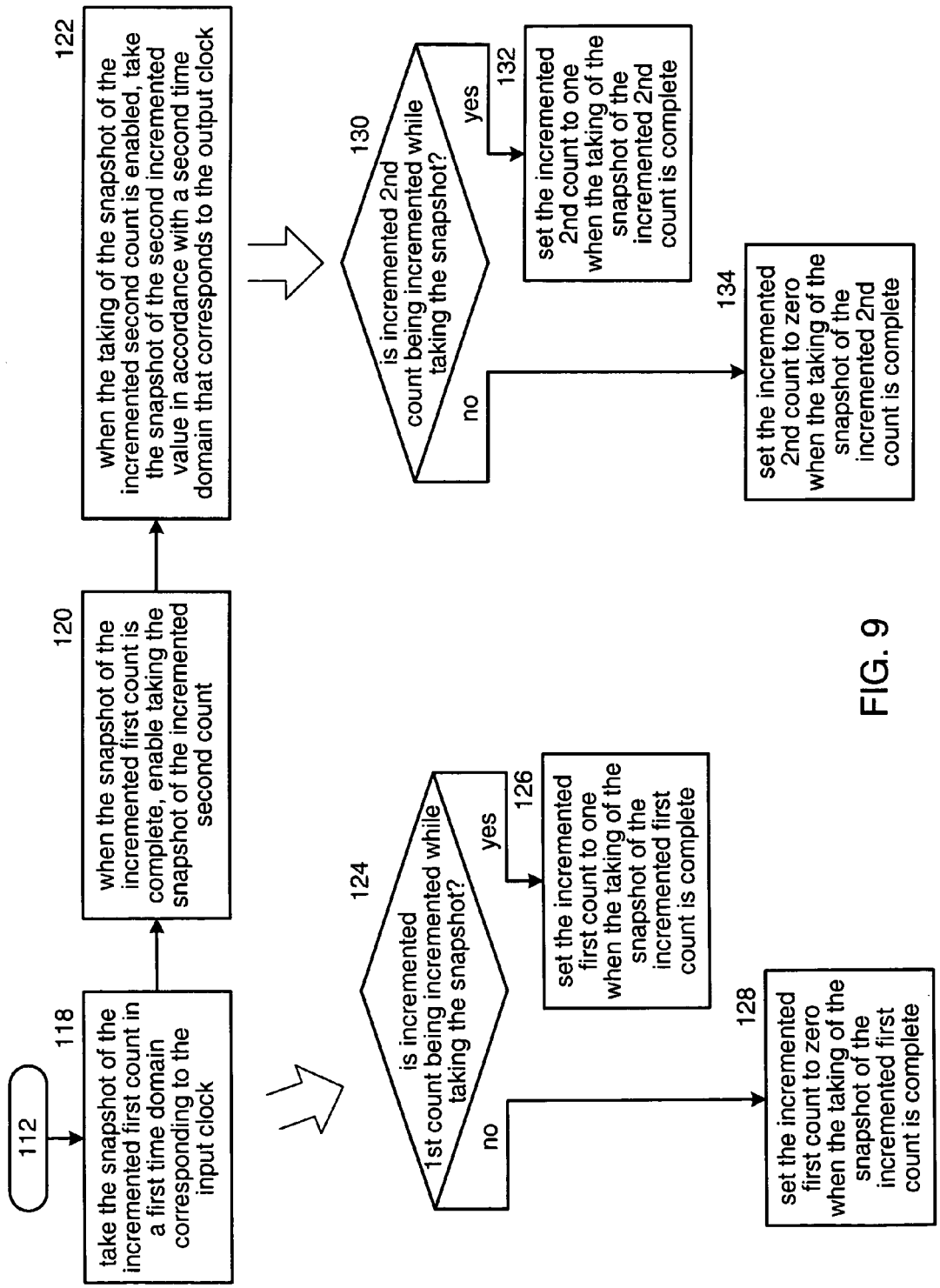
FIG. 9 is a logic diagram of a method further defining Step 112 of FIG. 8.

FIG. 9 is a method illustrating the periodic snapshots of the $1^{st}$ and $2^{nd}$ counts. The process begins at Step 118 where the snapshot of the incremented $1^{st}$ count is taken in a $1^{st}$ time domain that corresponds to the input clock. This is done as shown in Steps 124–126. At Step 124, a determination is made as to whether the incremented $1^{st}$ count is being incremented while the snapshot is being taken. If not, the process proceeds to Step 128 where the incremented $1^{st}$ count is set to zero once the snapshot is taken. If the incrementing is occurring while the snapshot is being taken, the process proceeds to Step 126. At Step 126, the incremented $1^{st}$ count is set to 1 once the snapshot has been completed.

Once the $1^{st}$ snapshot has been taken, the process proceeds to Step 120 where the taking of the snapshot of the incremented $2^{nd}$ count is enabled. The process then proceeds to Step 122 where the snapshot of the $2^{nd}$ incremented count value is taken in accordance with a $2^{nd}$ timed domain that corresponds to the output clock. This may be done as illustrated in Steps 130–134. At Step 130, a determination is made as to whether the incrementing of the $2^{nd}$ count is occurring during the taking of the snapshot of the incremented $2^{nd}$ count. If not, the process proceeds to Step 134 where the incremented $2^{nd}$ count is set to zero once the snapshot is complete. If the $2^{nd}$ count is being incremented while a snapshot is being taken, the process proceeds to Step 132 where the incremented $2^{nd}$ count is set to 1 once the snapshot is complete.

Figure 10:
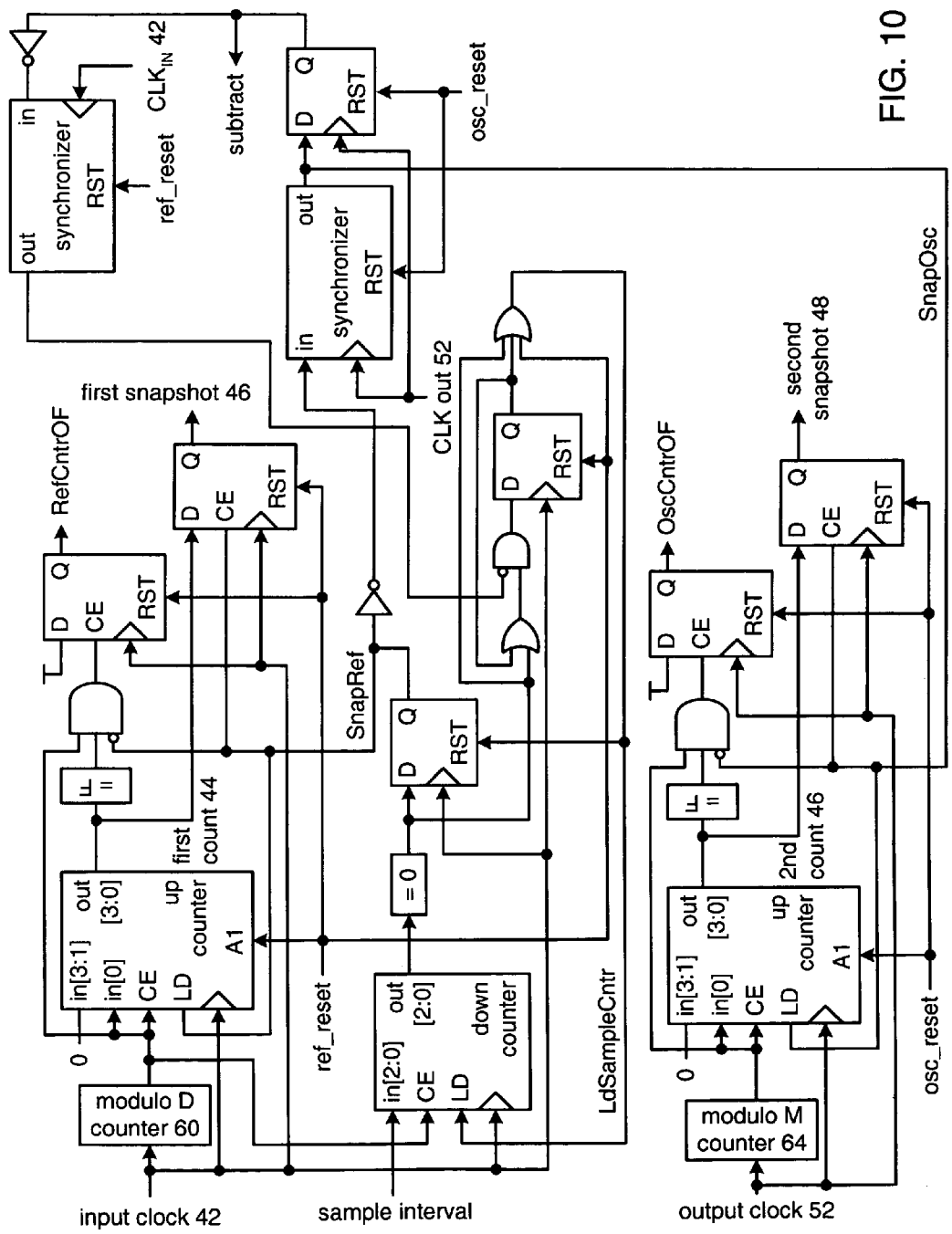
FIG. 10 is a schematic block diagram of the snapshot module and $1^{st}$ and $2^{nd}$ count modules of a low jitter digital frequency synthesizer in accordance with the present invention.

FIG. 10 is a detailed schematic block diagram of the snapshot module 36 and the $1^{st}$ and $2^{nd}$ count modules 32 and 34. The $1^{st}$ count module 32 includes the modulo D counter 60 and the up-counter associated therewith. The $2^{nd}$ count module 34 includes the modulo M counter 64 and the up-counter associated therewith. The remaining components correspond to the snapshot module 36 to produce the $1^{st}$ snapshot 46 and $2^{nd}$ snapshot 48.

Figure 11:
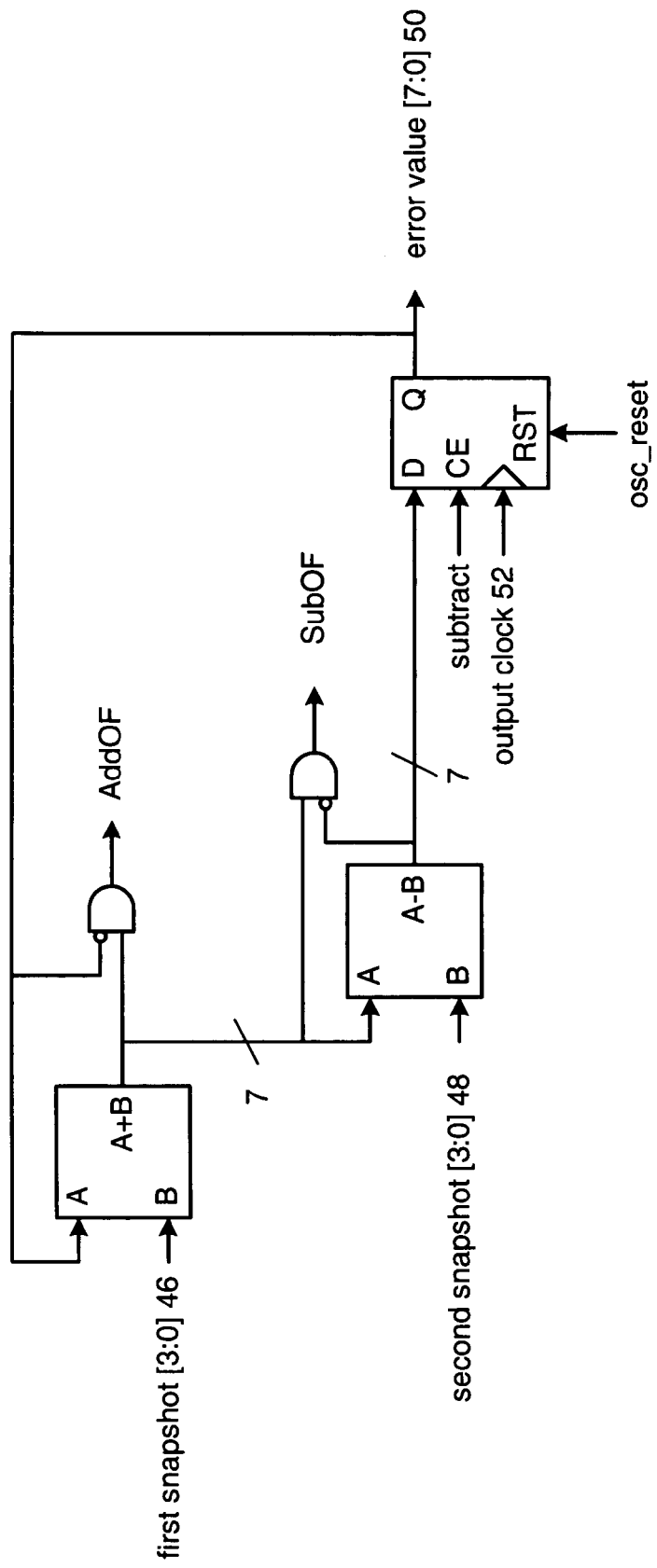
FIG. 11 is a schematic block diagram of an error value generation module of a low jitter frequency synthesizer in accordance with the present invention.

FIG. 11 is a schematic block diagram of an embodiment of the error value generation module 38 that includes an addition module, subtraction module and D flip-flop. As coupled, the error value generation module 38 produces the error value 50.

Figure 12:
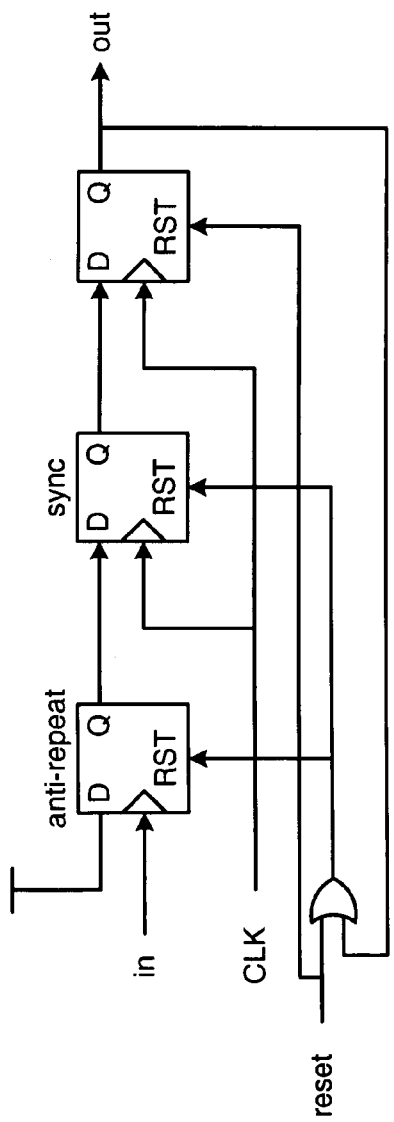
FIG. 12 is a schematic block diagram of a synchronizer module of the snapshot module as illustrated in FIG. 10.

FIG. 12 is a schematic block diagram of the synchronizer used in the snapshot module 36 of FIG. 10. The synchronizer in general aligns the sampling interval for taking the $1^{st}$ and $2^{nd}$ snapshots by transferring control to a different time domain without clock glitches.

Figure 13:
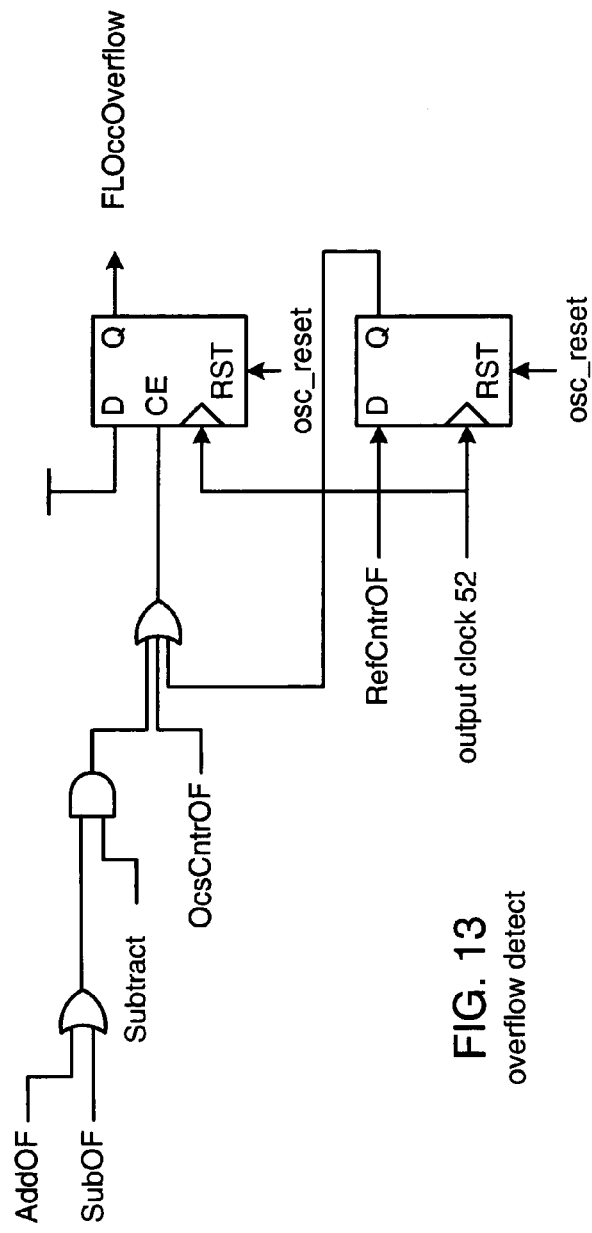
FIG. 13 is a schematic block diagram of an overflow detection module associated with the snapshot module of FIG. 10.

FIG. 13 illustrates an overflow detection circuit that may be included in the snapshot module 36 of FIG. 10 to detect whether an overflow condition has occurred with respect to the taking of the $1^{st}$ and $2^{nd}$ snapshots. If an overflow condition does occur, the current error calculation is inaccurate. The overflow condition is available as status, and the process is optionally reset.

Figure 14:
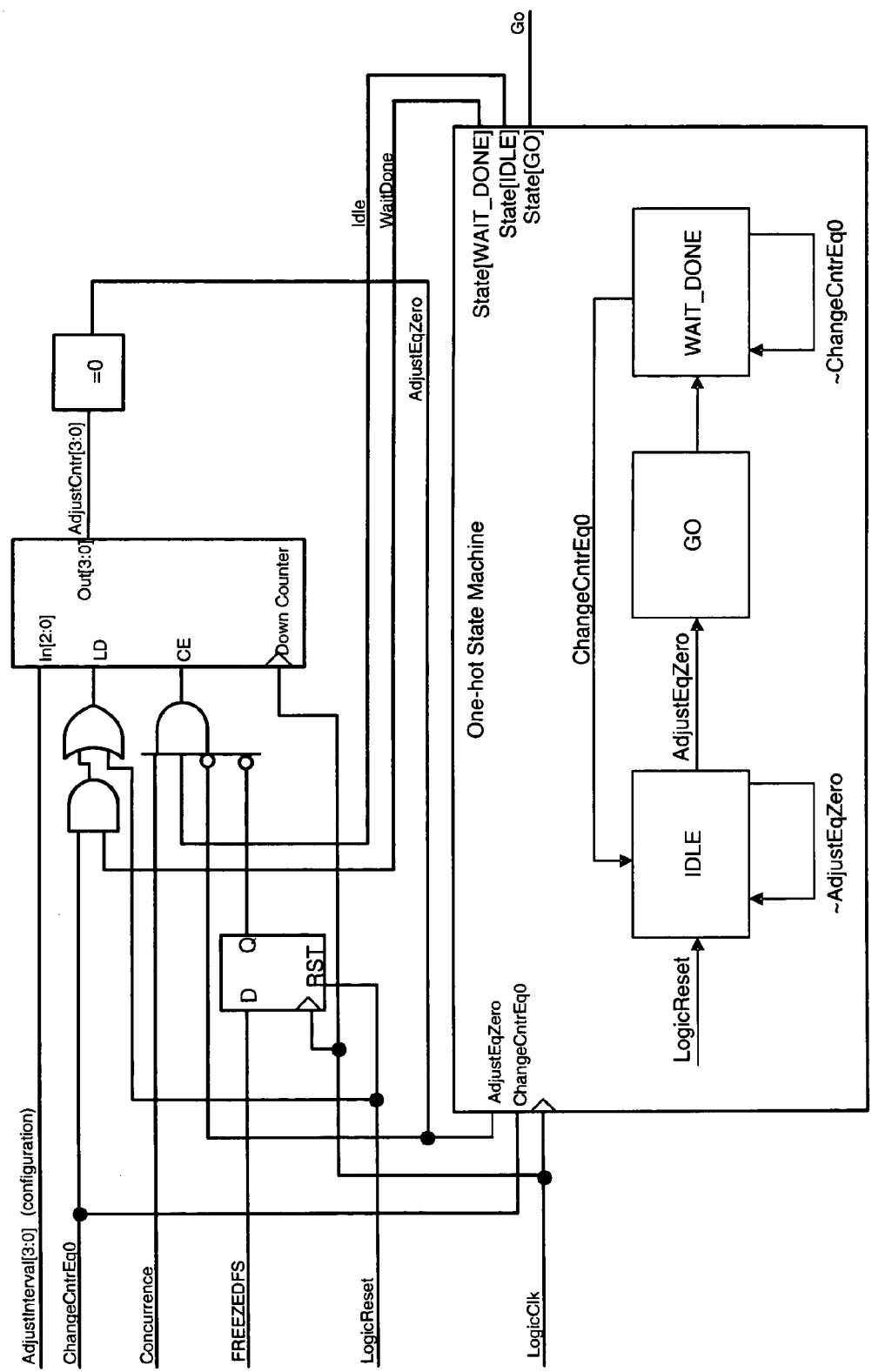
FIGS. 14 and 15 are schematic block diagrams of a control module of a low jitter digital frequency synthesizer in accordance with the present invention.
Figure 15:
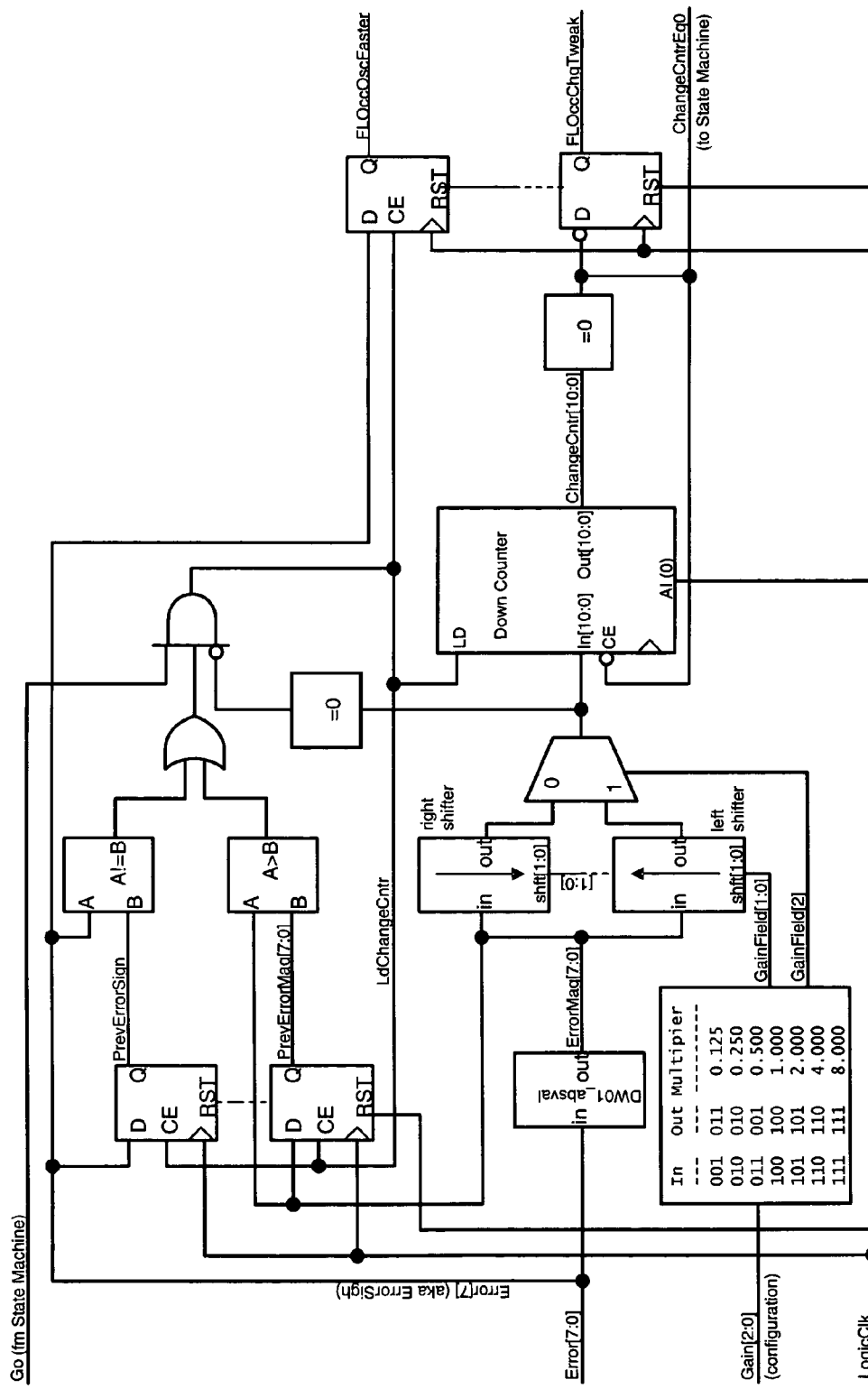

FIGS. 14 and 15 are schematic block diagrams of a first portion of the tap/trim/tweak of the digital delay line 40 as may be included in the control module 82 and/or the oscillation rate control module. The Tap/Trim/Tweak Adjustments performed by the control module 82 includes the control module 82 periodically reading the Error register and conditionally adjusting the oscillator frequency by adding or subtracting one or more Tweak units to/from the Tap/Trim/Tweak counter. Note that this logic is separate from the Frequency Error Accumulator logic, except that is uses the signed Error value (and it adjusts the oscillator frequency, which will eventually be sensed by that logic).

The adjustment rate is controlled by the 4-bit AdjustInterval configuration field by loading it into a down counter that counts Concurrence pulses in the LogicClk domain. When the counter reaches zero, the Go signal initiates an adjustment cycle. If FREEZEDFS is active, count-down is disabled, so the Go signal is not generated until FREEZEDFS goes inactive.

The number of Tweak units that are added or subtracted is a function of the Error magnitude and Gain, a 3-bit configuration field. Tweak delta equals ErrorMag times 2n, where n is an integer in the range −3 to +3, inclusive (corresponding to Gain configurations ranging from 001 to 111).

All adjustment cycles may not actually cause a change in Tap/Trim/Tweak. For a change to occur, both of the following must be true:

ErrorMag must be greater than it was at the previous change, or the Error sign is different from the previous change.

The integer portion of ErrorMag times 2n is greater than zero.

The Tap/Trim/Tweak count can be changed only one unit per clock cycle. Whenever ChangeCntr is non-zero, D flip-flop FLOccChgTweak is set. One cycle earlier, the FLOccOscFaster flip-flop was set or cleared, depending on whether Error is negative or positive, respectively. When FLOccOscFaster is true, Tap/Trim/Tweak is incremented; otherwise, it is decremented.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The preceding discussion has presented a low jitter digital frequency synthesizer that utilizes a free-running oscillator. By decoupling the input clock from the output clock jitter induced by the input clock is avoided such that the output clock is substantially jitter-free other than the jitter inherently produced by the characteristics of the free-running oscillator. As one of average skill in the art will appreciate, other embodiments may be derived from the teaching of the present invention without deviating from the scope of the claims.

What is claimed is:

1. A method for controlling a low jitter digital frequency synthesizer, the method comprises:

counting cycles of an input clock to produce an input clock count;

counting cycles of an output clock to produce an output clock count;

when the input clock count reaches a value of D, incrementing a first counter to produce an incremented first count;

when the output clock count reaches a value of M, incrementing a second counter to produce an incremented second count;

periodically taking a snapshot of the incremented first count to produce a snapshot first count;

periodically taking a snapshot of the incremented second count to produce a snapshot second count;

generating an error value based on the snapshot first count and the snapshot second count; and adjusting a delay line tap value based on the error value.

2. The method of claim 1, wherein the counting cycles of the input clock comprises:
   modulo D counting the cycles of the input clock.
3. The method of claim 1, wherein the counting cycles of the output clock comprises:
   modulo M counting the cycles of the output clock.
4. The method of claim 1, wherein the periodically taking the snapshot of the incremented first count comprises:
   determining whether an increment of the incremented first count is occurring while taking the snapshot;
   when the increment of the incremented first count is occurring while taking the snapshot, setting the incremented first count to one when the taking of the snapshot of the incremented first count is complete; and
   when the increment of the incremented first count is not occurring while taking the snapshot, setting the incremented first count to zero when the taking of the snapshot of the incremented first count is complete.
5. The method of claim 1, wherein the periodically taking the snapshot of the incremented second count comprises:
   determining whether an increment of the incremented second count is occurring while taking the snapshot;
   when the increment of the incremented second count is occurring while taking the snapshot, setting the incremented second count to one when the taking of the snapshot of the incremented second count is complete; and
   when the increment of the incremented second count is not occurring while taking the snapshot, setting the incremented second count to zero when the taking of the snapshot of the incremented second count is complete.
6. The method of claim 1, wherein the generating the error value comprises:
   adding one of the snapshot first count or the snapshot second count with a previous error value to produce an addition error value; and
   determining the error value as a difference between the addition error value and another one of the snapshot first value and the snapshot second value.
7. The method of claim 1, wherein the periodically taking the snapshot of the incremented first count and the periodically taking the snapshot of the incremented second count comprise:
   within in a period of the periodically taking of the snapshots of the increment first count and the incremented second count:
      taking the snapshot of the incremented first count in a first time domain corresponding to the input clock;
      when the snapshot of the incremented first count is complete, enabling taking the snapshot of the incremented second count;
      when the taking of the snapshot of the incremented second count is enabled, taking the snapshot of the second incremented value in accordance with a second time domain that corresponds to the output clock; and
      when the taking of the snapshot of the incremented second count is completed, repeating the taking of the snapshot of the incremented first value and the incremented second value in a subsequent period of the periodically taking of the snapshots.
8. The method of claim 1, wherein the adjusting the delay line tap value based on the error value comprises:
   comparing the error value with a previous error value to determine whether sign of the error value has changed with respect to the previous error value; and
   when the sign of the error value has changed, determining amount of the adjusting the delay line tap based on the current error value and parameters of the digital frequency synthesizer.
9. The method of claim 1, wherein the adjusting the delay line tap value based on the error value comprises:
   comparing the error value with a previous error value to determine whether magnitude of the error value has increased with respect to the previous error value; and
   when the magnitude of the error value has increased, determining amount of the adjusting the delay line tap based on the current error value and parameters of the digital frequency synthesizer.
10. An apparatus for controlling a low jitter digital frequency synthesizer, the apparatus comprises:
    a processing module; and
    memory operably coupled to the processing module, wherein the memory stores operational instructions that cause the processing module to:
    count cycles of an input clock to produce an input clock count;
    count cycles of an output clock to produce an output clock count;
    when the input clock count reaches a value of D, increment a first counter to produce an incremented first count;
    when the output clock count reaches a value of M, increment a second counter to produce an incremented second count;
    periodically take a snapshot of the incremented first count to produce a snapshot first count;
    periodically take a snapshot of the incremented second count to produce a snapshot second count;
    generate an error value based on the snapshot first count and the snapshot second count; and
    adjust a delay line tap value based on the error value.
11. The apparatus of claim 10, wherein the memory further stores operational instructions that cause the processing module to count cycles of the input clock by:
    modulo D counting the cycles of the input clock.
12. The apparatus of claim 10, wherein the memory further stores operational instructions that cause the processing module to count cycles of the output clock by:
    modulo M counting the cycles of the output clock.
13. The apparatus of claim 10, wherein the memory further stores operational instructions that cause the processing module to periodically take the snapshot of the incremented first count by:
    determining whether an increment of the incremented first count is occurring while taking the snapshot;
    when the increment of the incremented first count is occurring while taking the snapshot, setting the incremented first count to one when the taking of the snapshot of the incremented first count is complete; and
    when the increment of the incremented first count is not occurring while taking the snapshot, setting the incremented first count to zero when the taking of the snapshot of the incremented first count is complete.
14. The apparatus of claim 10, wherein the memory further stores operational instructions that cause the processing module to periodically take the snapshot of the incremented second count by:
    determining whether an increment of the incremented second count is occurring while taking the snapshot;
    when the increment of the incremented second count is occurring while taking the snapshot, setting the incremented second count to one when the taking of the snapshot of the incremented second count is complete; and when the increment of the incremented second count is not occurring while taking the snapshot, setting the incremented second count to zero when the taking of the snapshot of the incremented second count is complete.

15. The apparatus of claim 10, wherein the memory further stores operational instructions that cause the processing module to generate the error value by:

adding one of the snapshot first count or the snapshot second count with a previous error value to produce an addition error value; and determining the error value as a difference between the addition error value and another one of the snapshot first value and the snapshot second value.

16. The apparatus of claim 10, wherein the memory further stores operational instructions that cause the processing module to periodically take the snapshot of the incremented first count and the periodically take the snapshot of the incremented second count by:

within in a period of the periodically taking of the snapshots of the increment first count and the incremented second count:

taking the snapshot of the incremented first count in a first time domain corresponding to the input clock;

when the snapshot of the incremented first count is complete, enabling taking the snapshot of the incremented second count;

when the taking of the snapshot of the incremented second count is enabled, taking the snapshot of the second incremented value in accordance with a second time domain that corresponds to the output clock; and when the taking of the snapshot of the incremented second count is completed, repeating the taking of the snapshot of the incremented first value and the incremented second value in a subsequent period of the periodically taking of the snapshots.

17. The apparatus of claim 10, wherein the memory further stores operational instructions that cause the processing module to adjust the delay line tap value based on the error value by:

comparing the error value with a previous error value to determine whether sign of the error value has changed with respect to the previous error value; and when the sign of the error value has changed, determining amount of the adjusting the delay line tap based on the current error value and parameters of the digital frequency synthesizer.

18. The apparatus of claim 10, wherein the memory further stores operational instructions that cause the processing module to adjust the delay line tap value based on the error value by:

comparing the error value with a previous error value to determine whether magnitude of the error value has increased with respect to the previous error value; and when the magnitude of the error value has increased, determining amount of the adjusting the delay line tap based on the current error value and parameters of the digital frequency synthesizer.

19. A low jitter digital frequency synthesizer comprises:

a first counter module operably coupled to count intervals of M cycles of an input clock of the low jitter digital frequency synthesizer to produce a first count;

a second counter module operably coupled to count intervals of D cycles of an output clock of the low jitter digital frequency synthesizer to produce a second count, wherein a rate of the output clock corresponds to M/D times a rate of the input clock;

a snapshot module operably coupled to periodically take a snapshot of the first count to produce a first snapshot and of the second count to produce a second snapshot;

an error value generation module operably coupled to generate an error value based on the first and second snapshots; and a tapped delay line module operably coupled to produce the output clock based on the error value.

20. The low jitter digital frequency synthesizer of claim 19, wherein the first counter module comprises:

a modulo M counter operably coupled to modulo M count cycles of the input clock to produce a first modulo count; and a first incrementing counter operably coupled to increment the first count based on a wrap-around of the first modulo count.

21. The low jitter digital frequency synthesizer of claim 19, wherein the first counter module comprises:

a modulo D counter operably coupled to modulo D count cycles of the output clock to produce a second modulo count; and a second incrementing counter operably coupled to increment the second count based on a wrap-around of the second modulo count.

22. The low jitter digital frequency synthesizer of claim 19, wherein the snapshot module comprises:

a reset module operably coupled to:

determining whether an increase of the first count is occurring while taking the snapshot of the first count;

when the increase of the first count is occurring while taking the snapshot of the first count, setting the first count to one when the taking of the snapshot of the first count is complete; and when the increase of the first count is not occurring while taking the snapshot of the first count, setting the first count to zero when the taking of the snapshot of the first count is complete.

23. The low jitter digital frequency synthesizer of claim 19, wherein the snapshot module comprises:

a reset module operably coupled to:

determining whether an increase of the second count is occurring while taking the snapshot of the second count;

when the increase of the second count is occurring while taking the snapshot of the second count, setting the second count to one when the taking of the snapshot of the second count is complete; and when the increase of the second count is not occurring while taking the snapshot of the second count, setting the second count to zero when the taking of the snapshot of the second count is complete.

24. The low jitter digital frequency synthesizer of claim 19, wherein error value generation module further functions to:

add one of the first snapshot or the second snapshot to a previous error value to produce an addition error value; and determine the error value as a difference between the addition error value and another one of the first snapshot and the second snapshot.

25. The low jitter digital frequency synthesizer of claim 19, wherein the snapshot module further functions to:

within in a period of the periodically taking of the snapshots of the first count and the second count:
take the snapshot of the first count in a first time domain corresponding to the input clock;
when the snapshot of the first count is complete, enable taking the snapshot of the second count;
when the taking of the snapshot of the second count is enabled, take the snapshot of the second value in accordance with a second time domain that corresponds to the output clock; and
when the taking of the snapshot of the second count is completed, repeat the taking of the snapshot of the first value and the second value in a subsequent period of the periodically taking of the snapshots.

26. The low jitter digital frequency synthesizer of claim 19, wherein the tapped delay line module comprises a control module operable coupled to adjust the delay line tap value based on the error value by:
comparing the error value with a previous error value to determine whether sign of the error value has changed with respect to the previous error value; and
when the sign of the error value has changed, determining amount of the adjusting the tapped delay line module based on the current error value and parameters of the digital frequency synthesizer.

27. The low jitter digital frequency synthesizer of claim 19, wherein the tapped delay line module comprises a control module operable coupled to adjust the delay line tap value based on the error value by:
comparing the error value with a previous error value to determine whether magnitude of the error value has increased with respect to the previous error value; and
when the magnitude of the error value has increased, determining amount of the adjusting the tapped delay line module based on the current error value and parameters of the digital frequency synthesizer.

28. A programmable logic device comprises:
a programmable logic fabric;
memory operably coupled to the programmable logic fabric;
an input/output section operably coupled to the programmable logic fabric and to the memory, wherein the input/output section includes a low jitter digital frequency synthesizer that includes:
a first counter module operably coupled to count intervals of M cycles of an input clock of the low jitter digital frequency synthesizer to produce a first count;
a second counter module operably coupled to count intervals of D cycles of an output clock of the low jitter digital frequency synthesizer to produce a second count, wherein a rate of the output clock corresponds to M/D times a rate of the input clock;
a snapshot module operably coupled to periodically take a snapshot of the first count to produce a first snapshot and of the second count to produce a second snapshot;
an error value generation module operably coupled to generate an error value based on the first and second snapshots; and
a tapped delay line module operably coupled to produce the output clock based on the error value.

29. The programmable logic device of claim 28, wherein the first counter module comprises:
a modulo M counter operably coupled to modulo M count cycles of the input clock to produce a first modulo count; and
a first incrementing counter operably coupled to increment the first count based on a wrap-around of the first modulo count.

30. The programmable logic device of claim 28, wherein the first counter module comprises:
a modulo D counter operably coupled to modulo D count cycles of the output clock to produce a second modulo count; and
a second incrementing counter operably coupled to increment the second count based on a wrap-around of the second modulo count.

31. The programmable logic device of claim 28, wherein the snapshot module comprises:
a reset module operably coupled to:
determining whether an increase of the first count is occurring while taking the snapshot of the first count;
when the increase of the first count is occurring while taking the snapshot of the first count, setting the first count to one when the taking of the snapshot of the first count is complete; and
when the increase of the first count is not occurring while taking the snapshot of the first count, setting the first count to zero when the taking of the snapshot of the first count is complete.

32. The programmable logic device of claim 28, wherein the snapshot module comprises:
a reset module operably coupled to:
determining whether an increase of the second count is occurring while taking the snapshot of the second count;
when the increase of the second count is occurring while taking the snapshot of the second count, setting the second count to one when the taking of the snapshot of the second count is complete; and
when the increase of the second count is not occurring while taking the snapshot of the second count, setting the second count to zero when the taking of the snapshot of the second count is complete.

33. The programmable logic device of claim 28, wherein error value generation module further functions to:
add one of the first snapshot or the second snapshot to a previous error value to produce an addition error value; and
determine the error value as a difference between the addition error value and another one of the first snapshot and the second snapshot.

34. The programmable logic device of claim 28, wherein the snapshot module further functions to:
within in a period of the periodically taking of the snapshots of the first count and the second count:
take the snapshot of the first count in a first time domain corresponding to the input clock;
when the snapshot of the first count is complete, enable taking the snapshot of the second count;
when the taking of the snapshot of the second count is enabled, take the snapshot of the second value in accordance with a second time domain that corresponds to the output clock; and
when the taking of the snapshot of the second count is completed, repeat the taking of the snapshot of the first value and the second value in a subsequent period of the periodically taking of the snapshots.

35. The programmable logic device of claim 28, wherein the tapped delay line module comprises a control module operable coupled to adjust the delay line tap value based on the error value by:

comparing the error value with a previous error value to determine whether sign of the error value has changed with respect to the previous error value; and when the sign of the error value has changed, determining amount of the adjusting the tapped delay line module based on the current error value and parameters of the digital frequency synthesizer.

36. The programmable logic device of claim 28, wherein the tapped delay line module comprises a control module operable coupled to adjust the delay line tap value based on the error value by:

comparing the error value with a previous error value to determine whether magnitude of the error value has increased with respect to the previous error value; and when the magnitude of the error value has increased, determining amount of the adjusting the tapped delay line module based on the current error value and parameters of the digital frequency synthesizer.

\* \* \* \* \*